United States Patent
Fujii

(10) Patent No.: US 10,056,870 B1
(45) Date of Patent: Aug. 21, 2018

(54) BALANCED DISTRIBUTED POWER AMPLIFIER FOR MONOLITHIC MICROWAVE INTEGRATED CIRCUIT

(71) Applicant: MACOM Technology Solutions Holdings, Inc., Lowell, MA (US)

(72) Inventor: Kohei Fujii, San Jose, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 15/466,112

(22) Filed: Mar. 22, 2017

(51) Int. Cl.
H03F 3/26 (2006.01)
H03F 3/213 (2006.01)
H03F 3/195 (2006.01)
H03F 3/45 (2006.01)

(52) U.S. Cl.
CPC ............. *H03F 3/265* (2013.01); *H03F 3/195* (2013.01); *H03F 3/213* (2013.01); *H03F 3/45179* (2013.01); *H03F 2200/06* (2013.01); *H03F 2200/09* (2013.01); *H03F 2200/451* (2013.01); *H03F 2203/45172* (2013.01); *H03F 2203/45228* (2013.01)

(58) Field of Classification Search
None
See application file for complete search history.

(56) References Cited

U.S. PATENT DOCUMENTS

| | | | | |
|---|---|---|---|---|
| 3,487,339 A | * | 12/1969 | Griepentrog | H04N 5/4446 333/176 |
| 4,797,628 A | * | 1/1989 | Gruchalla | H03F 3/602 330/118 |
| 2005/0200425 A1 | * | 9/2005 | McKay | H01P 5/10 333/26 |
| 2009/0102574 A1 | * | 4/2009 | Vickes | H03F 3/602 333/25 |
| 2014/0375387 A1 | * | 12/2014 | Campbell | H03F 3/16 330/286 |
| 2017/0278686 A1 | * | 9/2017 | Brcka | H01J 37/3476 |

* cited by examiner

*Primary Examiner* — Patricia T Nguyen
(74) *Attorney, Agent, or Firm* — Thomas | Horstemeyer, LLP; Michael J. D'Aurelio; Jason M. Perilla

(57) ABSTRACT

An apparatus includes an input transformer, an amplifier and an output transformer. The input transformer may be on a substrate and configured to convert an input signal into a differential input signal. The input signal may be a radio-frequency signal. The amplifier may be on the substrate and configured to generate a differential output signal in response to the differential input signal. The amplifier may be a balanced and distributed amplifier. The output transformer may be on the substrate and configured to convert the differential output signal into an output signal. Each of the input transformer and the output transformer may be a three line coupled balun transformer with a variable bandpass bandwidth.

20 Claims, 7 Drawing Sheets

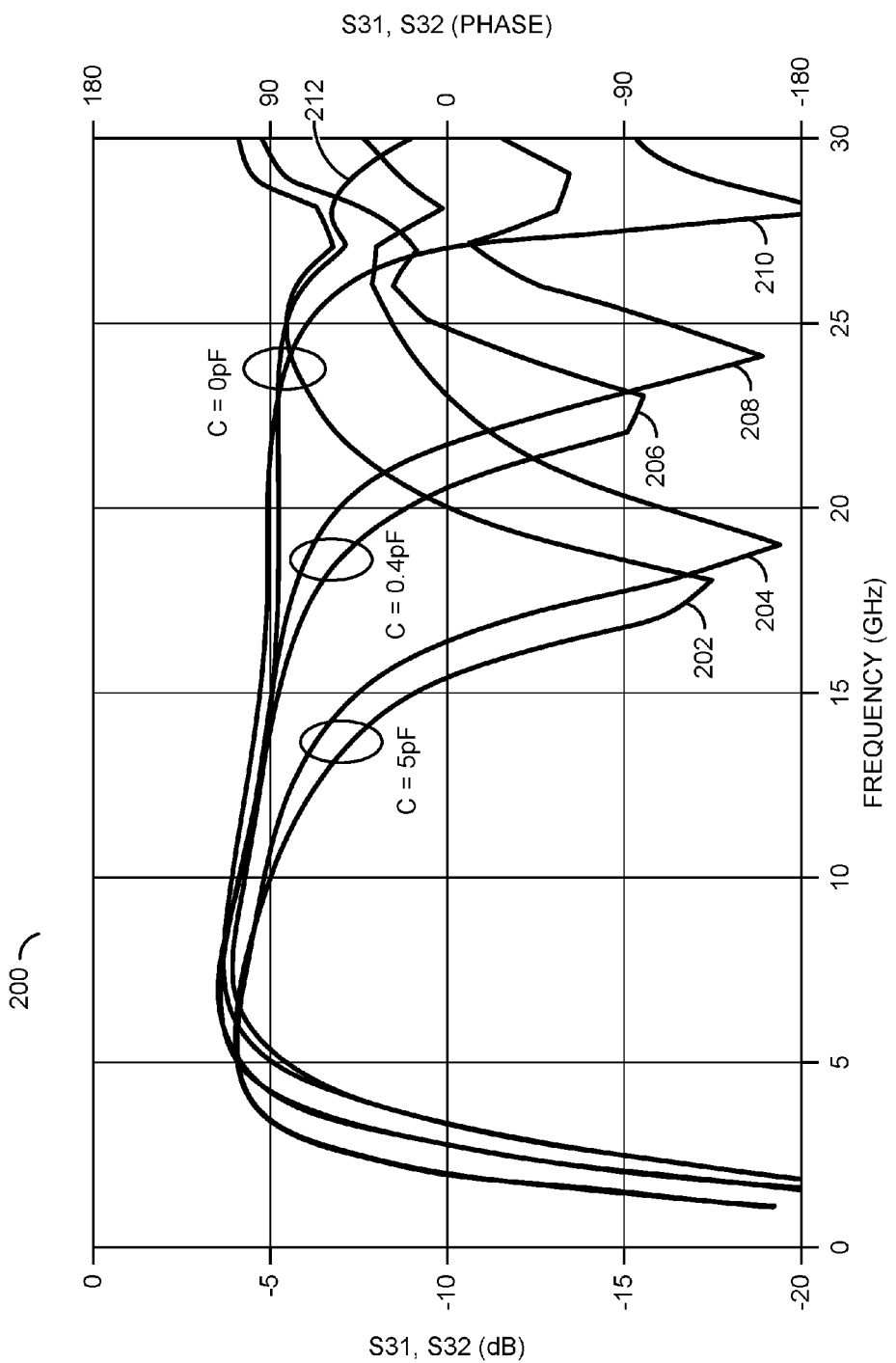

US 10,056,870 B1

BALANCED DISTRIBUTED POWER AMPLIFIER FOR MONOLITHIC MICROWAVE INTEGRATED CIRCUIT

FIELD OF THE INVENTION

The invention relates to power amplifiers generally and, more particularly, to a method and/or apparatus for implementing a balanced distributed power amplifier for a monolithic microwave integrated circuit.

BACKGROUND

Conventional distributed power amplifiers are able to cover many discrete operational frequency bands due to inherent broadband operation. The conventional distributed amplifiers show high signal-to-noise ratios outside of an operational band when compared with a narrow band amplifier. The distributed amplifiers increase the signal-to-noise ratio in the out-of-band range when used for narrow band applications. The signal-to-noise ratio is important for receiver applications so the distributed amplifiers are not commonly used for low noise amplifier applications. Another issue of conventional distributed power amplifiers is a higher unwanted harmonic power generation. Due to the broad frequency band capability, the distributed amplifiers often have high gain at second harmonic frequencies and at third harmonic frequencies.

It would be desirable to implement a balanced distributed power amplifier for a monolithic microwave integrated circuit.

SUMMARY

The invention concerns an apparatus including an input transformer, an amplifier and an output transformer. The input transformer may be on a substrate and configured to convert an input signal into a differential input signal. The input signal may be a radio-frequency signal. The amplifier may be on the substrate and configured to generate a differential output signal in response to the differential input signal. The amplifier may be a balanced and distributed amplifier. The output transformer may be on the substrate and configured to convert the differential output signal into an output signal. Each of the input transformer and the output transformer may be a three line coupled balun transformer with a variable bandpass bandwidth.

BRIEF DESCRIPTION OF THE FIGURES

Embodiments of the invention will be apparent from the following detailed description and the appended claims and drawings in which:

FIG. 8 is a graph of scattering parameter simulations of the output balun.

DETAILED DESCRIPTION OF THE EMBODIMENTS

Embodiments of the present invention include providing a balanced distributed power amplifier for a monolithic microwave integrated circuit that may (i) utilize on-chip balun transformers, (ii) implement magnetically coupled impedance transforming baluns, (iii) implement the balun transformers as three line coupled transformers, (iv) implement the balun transformers as planar transformer, (v) implement the balun transformers using at most two conductive layers, (vi) consume a compact die size, (vii) improve output power combining efficiency, (viii) be implemented as a monolithic microwave integrated circuit, (ix) provide an adjustable frequency band and/or (x) be implemented as one or more integrated circuits.

Embodiments of the invention generally provide a balanced and distributed broadband power amplifier with an on-chip input balun transformer and an on-chip output balun transformer on a monolithic microwave integrated circuit (MMIC). Each balun transformer may be a magnetically coupled impedance transforming balun. Each impedance transforming balun is generally designed using a magnetic coupled transformer technique. Each impedance transforming balun may provide an adjustable bandpass frequency band.

Figure 1:
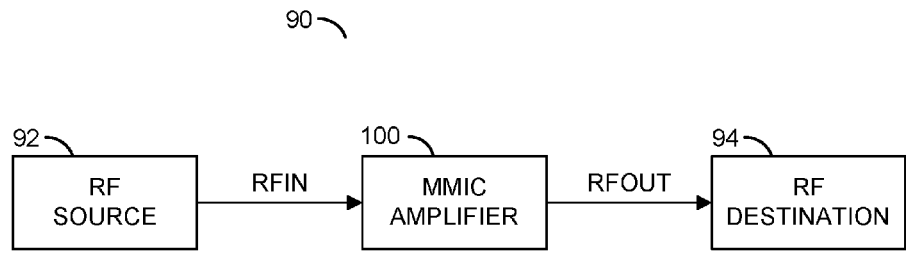
FIG. 1 is a block diagram of a system.

Referring to FIG. 1, a block diagram of a system 90 is shown in accordance with an embodiment of the invention. The system (or apparatus or circuit) 90 may implement a high frequency amplifier system. The circuit 90 generally comprises a block (or circuit) 92, a block (or circuit) 94 and a block (or circuit) 100. The circuits 92 to 100 may be implemented in hardware or simulated with software.

A signal (e.g., RFIN) may be generated by the circuit 92 and transferred to the circuit 100. The signal RFIN may convey a radio-frequency input signal received by the circuit 100. A signal (e.g., RFOUT) may be generated by the circuit 100 and presented to the circuit 94. The signal RFOUT may convey an amplified radio-frequency output signal generated by the circuit 100. In various embodiments, the signals RFIN and RFOUT may implement microwave frequency signals or millimeter-wave frequency signals. Other frequency ranges may be implemented to meet the criteria of a particular application.

The circuit 90 generally operates in a millimeter-wave frequency range and/or a microwave frequency range, for example at tens of gigahertz (e.g., GHz) frequencies. In various embodiments, the circuit 90 generates and amplifies the signal RFIN in a super high radio frequency range (e.g., 3 GHz to 30 GHz) and/or an extremely high radio frequency range (e.g., 30 GHz to 300 GHz). In some embodiments, the circuit 90 is designed to amplify signals in a 20 GHz to 40 GHz range. Other frequencies and ranges of frequencies may be implemented to meet the criteria of a particular application.

The circuit 92 may implement a radio-frequency (RF) source circuit. The source circuit 92 is may be operational to generate a radio-frequency signal in the microwave frequency range and/or the millimeter-wave frequency range. The radio-frequency signal may be presented in the signal RFIN to the circuit 100.

The circuit 94 may implement a radio-frequency destination circuit. The designation circuit 94 is generally operational to receive the radio-frequency signal in the signal RFOUT from the circuit 100. In various embodiments, the radio-frequency destination circuit 94 may implement an antenna, a load or receiver circuitry.

The circuit 100 may implement a monolithic microwave integrated circuit (MMIC) amplifier. The MMIC amplifier 100 is generally operational to amplify the radio-frequency signal received in the signal RFIN to generate the amplified radio-frequency signal in the signal RFOUT. In various embodiments, the MMIC amplifier circuit 100 may have an adjustable bandpass filter that may suppress second harmonic frequencies and/or third harmonic frequencies.

In some embodiments, the MMIC amplifier 100 may generate the signal RFOUT having several watts of power. In some embodiments, the signal RFOUT may convey multiple (e.g., four) watts of power to the radio-frequency designation circuit 94 in a Gallium Arsenide (e.g., GaAs) MMIC amplifier 100. Other power levels in the signal RFOUT may be implemented to meet the criteria of a particular application.

Figure 2:
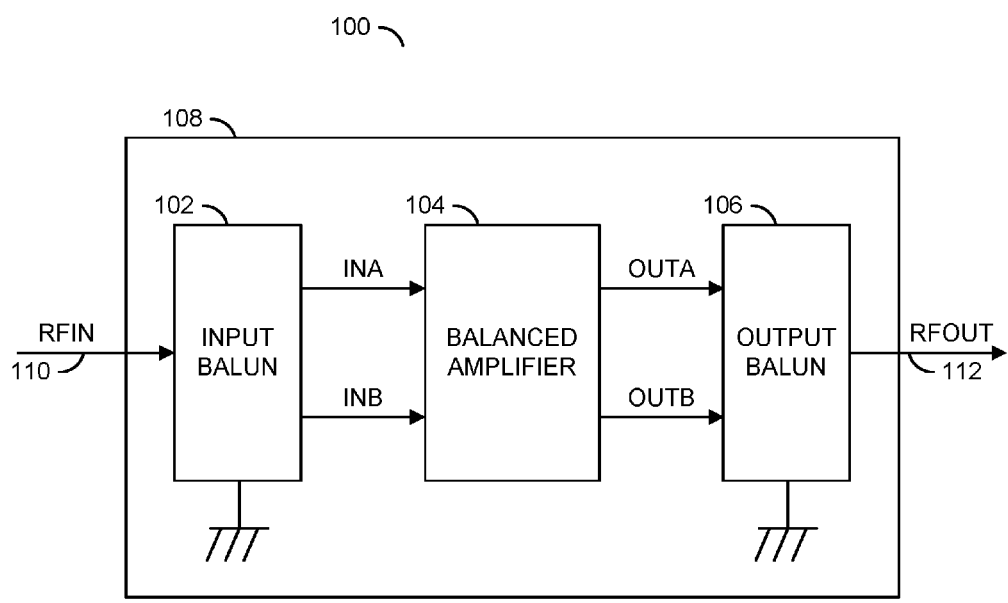
FIG. 2 is a block diagram of a monolithic microwave integrated circuit amplifier in the system.

Referring to FIG. 2, a block diagram of an example implementation of the MMIC amplifier 100 is shown. The MMIC amplifier 100 generally comprises a block (or circuit) 102, a block (or circuit) 104, a block (or circuit) 106, a substrate (or wafer) 108, a transmission line (or microstrip) 110 and a transmission line (or microstrip) 112. The circuits 102-106 and 110-112 may be fabricated in (on) the substrate 108. The circuits 102 to 112 may be implemented in hardware or simulated with software.

The circuit 102 may receive the signal RFIN on the transmission line 110. A pair of signals (e.g., INA and INB) may be generated by the circuit 102 and transferred to the circuit 104. The signals INA and INB may carry complementary (or differential) versions of the radio-frequency signal received in the signal RFIN. A pair of signals (e.g., OUTA and OUTB) may be generated by the circuit 104 and received by the circuit 106. The signals OUTA and OUTB may carry amplified complementary (or differential) versions of the radio-frequency signals received in the signals INA and INB, respectively. The circuit 106 may generate the signal RFOUT on the transmission line 112. The signal RFOUT may contain a combination of the amplified complementary radio-frequency signals in the signals OUTA and OUTB. The circuit 102 may implement an input balun circuit (or coupler). In various embodiments, the input balun 102 may be a magnetically coupled impedance transforming balun. The input balun 102 is generally operational to efficiently generate the differential signals INA and INB from the signal RFIN. The input balun 102 may also provide impedance matching between the transmission line 110 that carries the signal RFIN and an input impedance of the circuit 104. In various embodiments, the input balun 104 may provide a 1:1 ratio for the impedance of the transmission line 110 and/or radio-frequency source 92 to the input impedance of the circuit 104. The input balun 102 may be fabricated in (on) the substrate 108.

The circuit 104 may implement a balanced amplifier. In various embodiments, the balanced amplifier 104 may implement a balanced and distributed power amplifier. The balanced amplifier is generally operational to amplify the radio-frequency signal received in the signal INA to generate the signal OUTA. The balanced amplifier 104 may also be operational to amplify the radio-frequency signal received in the signal INB to generate the signal OUTB. The balanced amplifier 104 may be fabricated in (or on) the substrate 108.

The circuit 106 may implement an output balun circuit (or power combiner coupler). In various embodiments, the output balun 106 may be a magnetically coupled impedance transforming balun. The output balun 106 is generally operational to efficiently combine the differential signals OUTA and OUTB to generate the signal RFOUT. The output balun 106 may also provide impedance matching between an output impedance of the balanced amplifier 104 and the transmission line 112 that carries the signal RFOUT. In various embodiments, the output balun 106 may provide a 1:1 ratio for the output impedance of the balanced amplifier 104 to the impedance of the transmission line 112 and/or the impedance of the radio-frequency destination. The output balun 106 may be fabricated in (on) the substrate 108. In some embodiments, the output balun 106 may have a similar design to the input balun 102.

Figure 6:
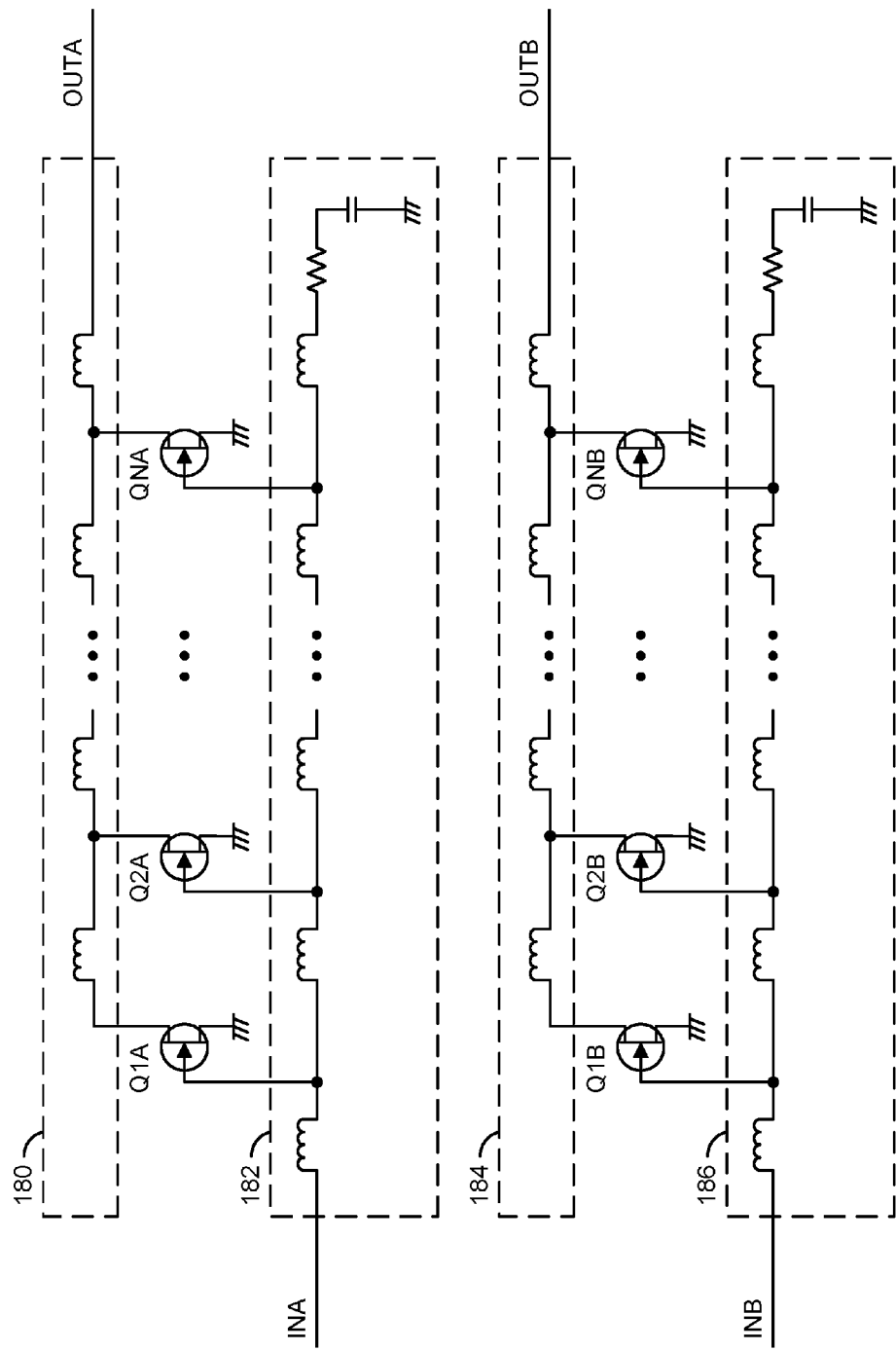
FIG. 6 is a schematic diagram of a balanced amplifier.

An output port impedance (e.g., Zo) for the balanced amplifier 104 may be defined by formula 1 as follows:

$$Zo = RL/N \qquad (1)$$

where the value of RL may be an optimum load impedance of each output transistor (e.g., field effect transistor) in the balanced amplifier 104, and the value of N may be an integer number of gain sections in the balanced amplifier. An example implementation of the balanced amplifier 104 with N stages and 2N output transistors is shown in FIG. 6.

The substrate 108 may implement a semiconductor substrate. The substrate 108 is generally operational to provide a base on which the input balun 102, the balanced amplifier 104 and the output balun 106 are fabricated (or implemented). In various embodiments, the substrate 106 may comprise a Galium Arsenide (GaAs) semiconductor, a Gallium Nitrate (GaN) semiconductor, a silicon (Si) substrate, or a Silicon Germanium (SiGe) semiconductor. Other types of semiconductors may be implemented to meet the design criteria of a particular application.

Figure 3:
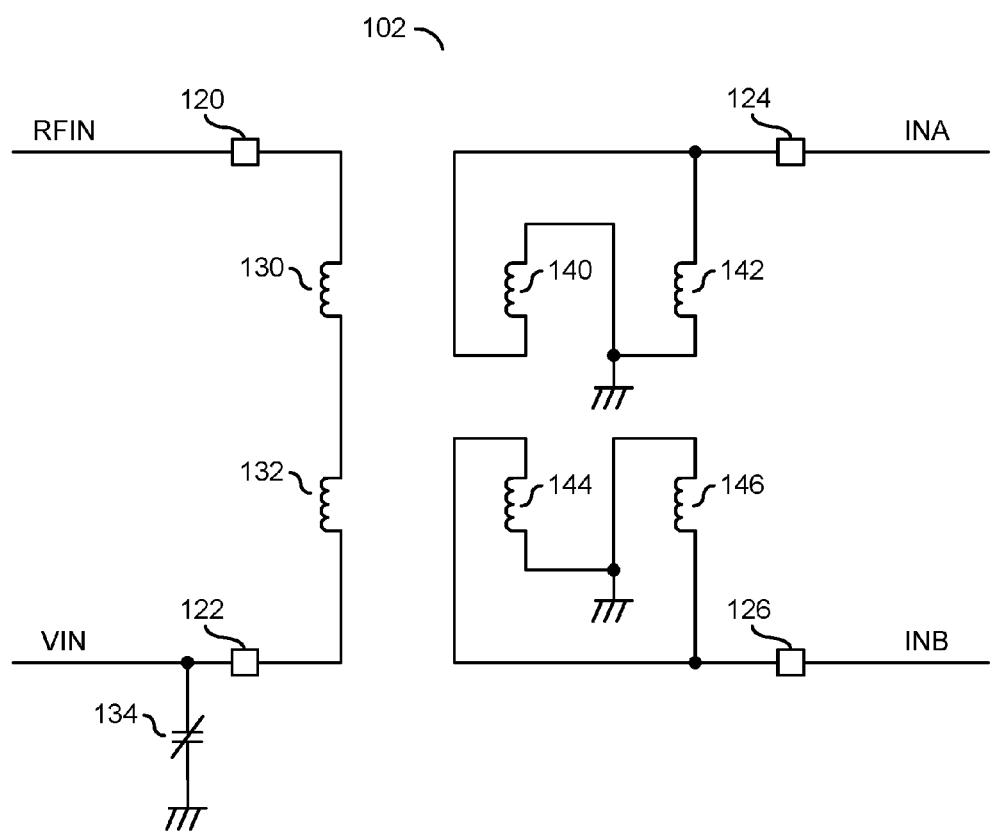
FIG. 3 is a schematic diagram of an input balun.

Referring to FIG. 3, a schematic diagram of an example implementation of the input balun 102 is shown. The input balun 102 generally comprises a simple winding between a port (or node) 120 and a port (or node) 122 and a complex winding between a port (or node) 124 and a port (or node) 126. The simple winding generally comprises multiple (e.g., two) series inductors 130 and 132. A variable capacitor 134 may be connected between the node 122 and a signal ground. In some embodiments, a signal (e.g., VIN) may be received by an end of the variable capacitor 134 connected to the node 122. The signal VIN may provide a control voltage used to adjust the capacitance of the variable capacitor 134. The variable capacitor 134 may be implemented using a varactor diode. The varactor diode capacitance may be realized as a gate-to-source capacitance of a field effect transistor formed in (on) the substrate 108. The signal VIN may be applied to a gate of the transistor to control the gate-to-source capacitance.

The complex winding generally comprises multiple (e.g., two) sets of parallel inductors. One set may include an inductor 140 and an inductor 142 each connected between the node 124 and the signal ground. The inductors 140 and 142 may be connected in parallel with each other and magnetically coupled to the inductor 130. The other set may include an inductor 144 and an inductor 146 each connected between the node 126 and the signal ground. The inductors 144 and 146 may be connected in parallel with each other and magnetically coupled to the inductor 132.

The node 120 may receive the signal RFIN. The variable capacitor 134 may be connected between the node 122 and the signal ground. The node 124 may present the signal INA. The node 126 may present the signal INB. The inductor sets 140/142 and 144/146 may be arranged such that the signal INA and INB are complementary (or differential) signals.

Figure 4:
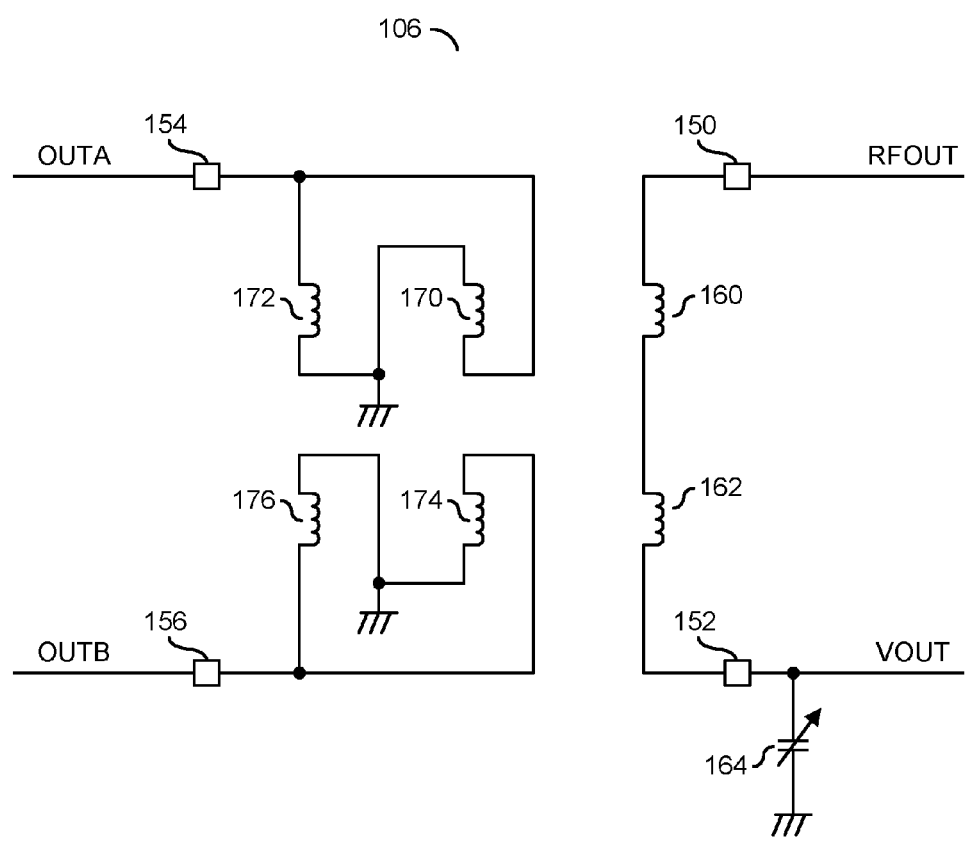
FIG. 4 is a schematic diagram of an output balun.

Referring to FIG. 4, a schematic diagram of an example implementation of the output balun 106 is shown. The output balun 106 generally comprises a complex winding between a port (or node) 154 and a port (or node) 156 and a simple winding between a port (or node) 150 and a port (or node) 152. The complex winding generally comprises multiple (e.g., two) sets of parallel inductors. One set may include an inductor 170 and an inductor 172 each connected between the node 154 and the signal ground. The inductors 170 and 172 may be connected in parallel with each other and magnetically coupled to an inductor 160. The other set may include an inductor 174 and an inductor 176 each connected between the node 156 and the signal ground. The inductors 174 and 176 may be connected in parallel with each other and magnetically coupled to an inductor 162.

The simple winding generally comprises multiple (e.g., two) series inductors 160 and 162. A variable capacitor 164 may be connected between the node 152 and the signal ground. In some embodiments, a signal (e.g., VOUT) may be received by an end of the variable capacitor 164 connected to the node 152. The signal VOUT may provide a control voltage used to adjust the capacitance of the variable capacitor 164. The variable capacitor 164 may be implemented using a varactor diode. The varactor diode capacitance may be realized as a gate-to-source capacitance of a field effect transistor formed in (on) the substrate 108. The signal VOUT may be applied to a gate of the transistor to control the gate-to-source capacitance.

The node 154 may receive the signal OUTA. The node 156 may receive the signal OUTB. The inductor sets 170/172 and 174/176 may be arranged such that the signal OUTA and OUTB are complementary (or differential) signals. The node 150 may present the signal RFOUT. The variable capacitor 164 may be connected between the node 152 and the signal ground.

Figure 5:
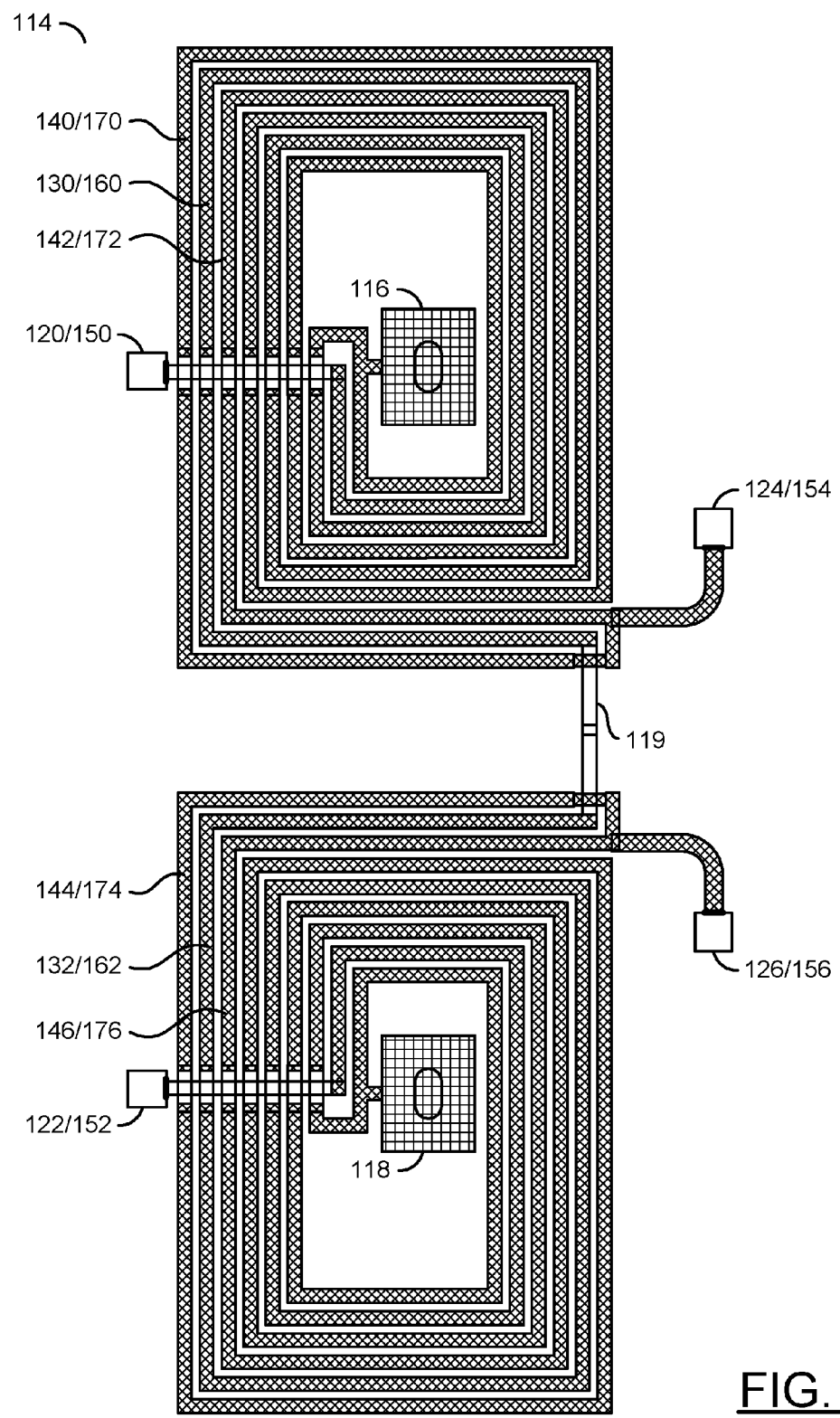
FIG. 5 is a layout diagram a balun transformer.

Referring to FIG. 5, a layout diagram of an example implementation of a balun transformer 114 is shown. The balun 114 may be representative of the input balun 102. The balun 114 may also be representative of the output balun 106. The balun 114 may be implemented in hardware or simulated with software.

The balun 114 may have the simple winding connected between the nodes 120 and 122 (e.g., the input nodes of the input balun 102) and between the nodes 150 and 152 (e.g., the output nodes of the output balun 106). The simple winding generally includes multiple (e.g., two) series coils (or inductors). For the input balun 102, the series coils may implement the inductors 130 and 132. For the output balun 106, the series coils may implement the inductors 160 and 162.

The balun 114 may have the complex winding connected between the nodes 124 and 126 (e.g., the output nodes of the input balun 102) and between the nodes 154 and 156 (e.g., the input nodes of the output balun 106). For the input balun 102, a set of parallel coils in the balun 114 generally implement the inductors 140 and 142. The signal ground for the inductors 140 and 142 may be implemented as a connection 116 in the center of the coils. Another set of parallel coils in the balun 114 generally implement the inductors 114 and 146. The signal ground for the inductors 144 and 146 may be implemented as a connection 118 in the center of the coils.

For the output balun 106, a set of parallel coils in the balun 114 generally implement the inductors 170 and 172. The connection 116 may implement the signal ground for the inductors 170 and 172. Another set of parallel coils in the balun generally implement the inductors 174 and 176. The connection 118 may implement the signal ground for the inductors 174 and 176.

The balun 114 generally comprises two sets of co-planer coils. Each set of coils may include multiple (e.g., three) concentric coils (e.g., 130/140/142 or 160/170/172; and 132/144/146 or 162/174/176). The coil 130 of the simple winding may be located between the parallel sets of coils 140 and 142. The coil 132 of the simple winding may be located between the parallel sets of coils 144 and 146. The coil 160 of the simple winding may be located between the parallel sets of coils 170 and 172. The coil 162 of the simple winding may be located between the parallel sets of coils 174 and 176. The series coils 130 and 132 may be connected by a trace 119. The series coils 160 and 162 may be connected by the trace 119.

The coils 130, 132, 140, 142, 144 and 146; or 160, 162, 170, 172, 174 and 176 may be fabricated on a single planar conductive (e.g., metal) layer on the substrate 108 (or an insulating layer on the substrate 108). Another conductive (e.g., metal) layer may be used to bridge across the traces that form the coils. For example, the coils 130, 140 and 142 may be co-planar and fabricated on the same conductive layer. The node 120 may be fabricated on the other conductive layer and connected to an end of the coil 130 through the other conductive layer. Likewise, the trace 119 may be fabricated in the other conductive layer to cross under the coils 130, 140 and 142 fabricated in the conductive layer.

The balun 114 may be designing using electro-magnetic (EM) simulation software. For example, the simulation software may be the AXIEM-3D Planar Electromagnetic Analysis Software available from National Instruments Corporation (AWR), El Segundo, Calif. In an example embodiment, the balun 114 may be implemented on a 50 micrometer (μm) thick GaAs wafer. An outside dimension of each set of spiral coils may be 365 μm by 265 μm. A conductor width of each trace may be 5 μm and conductor-to-conductor space may be 5 μm. A total conductor length for a single spiral inductor may be approximately a quarter wavelength at a center operational frequency. Other coil dimensions, other coil lengths, other conductor widths and/or other conductor-to-conductor spacings may be implemented to meet the design criteria of a particular application.

Referring to FIG. 6, a schematic diagram of an example implementation of the balanced amplifier 106 is shown. The balanced amplifier 106 generally comprises a block (or circuit) 180, a block (or circuit) 182, a block (or circuit) 184, a block (or circuit) 186 and multiple (e.g., 2N) transistors (or devices) Q1A to QNA and Q1B to QNB. The circuit 180 may present the signal OUTA. The circuit 182 may receive the signal INA. The circuit 184 may present the signal OUTB. The circuit 186 may receive the signal INB. Multiple (e.g., N) transistors (e.g., Q1A to QNA) may be connected between the circuit 180 and the circuit 182. Multiple (e.g., N) transistors (e.g., Q1B to QNB) may be connected between the circuit 184 and the circuit 186.

Each circuit 180 and 184 may implement an output transmission line. Each output transmission line 180 and 184 generally comprises multiple inductors connected in series. Each initial inductor may be connected between two initial transistors (e.g., between Q1A and Q2A and between Q1B and Q2B). Each successive inductor may be connected between two more transistors (e.g., between Q2A and Q3A and between Q2B and Q3B, etc.) The final inductors in each output transmission line 180 and 184 may be present the signals OUTA and OUTB, respectively.

Each circuit 182 and 196 may implement an input transmission line. Each input transmission line 182 and 186 generally comprises multiple inductors connected in series. The initial inductors in the input transmission lines 182 and 186 may receive the signals INA and INB, respectively. Each initial inductor may be connected to gates of the initial transistors (e.g., Q1A and Q1B). Each successive inductor may be connected between two of the transistors (e.g., between Q1A and Q2A and between Q1B and Q2B). The final inductors may be connected series to a load resistor and/or a capacitor to the signal ground.

The input signals INA and INB generally propagate along the input transmission lines 182 and 186 (e.g., left to right as shown in the figure). As the signals propagate past the gates of transistors Q1A to QNA and Q1B to QNB, the transistors Q1A to QNA and Q1B to QNB may amplify the input signals to generate respective output signals. The respective output signals may propagate along the output transmission lines 180 and 184 (e.g., left to right as shown in the figure). The output signals generated by each of the transistors Q1A to QNA and Q1B to QNB may add constructively in the output transmission lines 180 and 184 to create the output signals OUTA and OUTB. Since the input signal INA and the input signal INB are amplified by similar circuitry, the amplifier 104 may be balanced. Since the input signals INA and INB are amplified by multiple (e.g., N) stages, the balanced amplifier 104 may be distributed.

Figure 7:
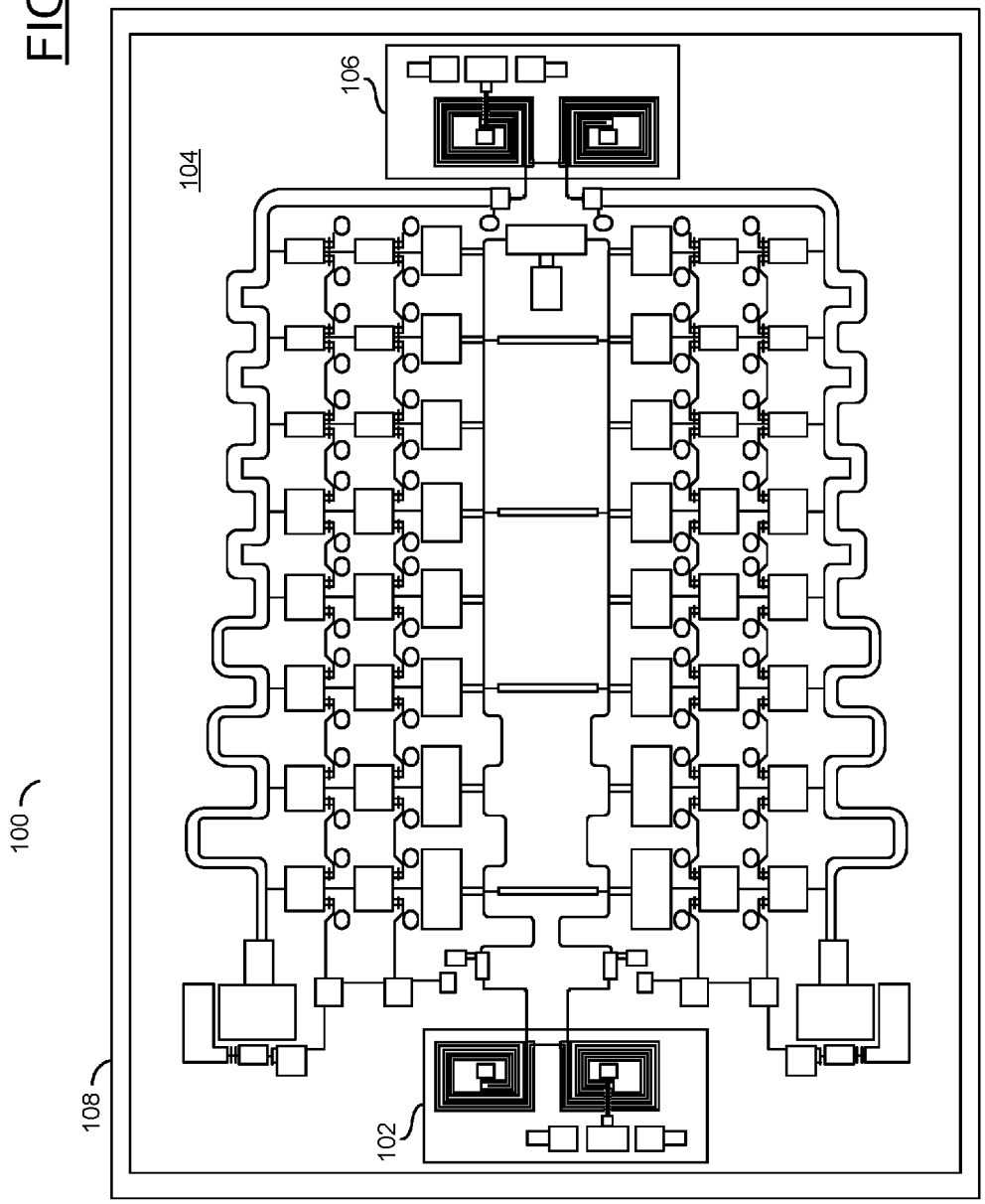
FIG. 7 is a diagram of a layout of the amplifier.

Referring to FIG. 7, a diagram of an example layout of the MMIC amplifier 100 is shown. The example layout of the MMIC amplifier 100 generally places the input balun 102 along one edge of the substrate 108, and the output balun 106 along an opposite edge of the substrate 108 as the input balun 102. The balanced amplifier 104 may be located between the input balun 102 and the output balun 106.

In various embodiments, the MMIC amplifier 100 may operate over a 2 GHz to 25 GHz frequency band with 2 watts saturated output power. The MMIC amplifier 100 is generally suitable for use in the S-band (e.g., 2 GHz to 4 GHz), the C-band (e.g., 4 GHz to 8 GHz), the X-band (e.g., 8 GHz to 12 GHz), and/or the Ku-band (e.g., 12 GHz to 18 GHz). Other frequency bands may be implemented to meet the design criteria of particular application.

Referring to FIG. 8, a graph of example simulations 200 of scattering parameter (s-parameters) of the output balun 106 is shown. The simulations 200 are generally cover a frequency range (e.g., 2 GHz to 30 GHz). The simulations 200 may illustrate insertion losses (e.g., S312 and S32 parameter of a 4-port model) in decibels (dB) along the left y-axis. The simulation 200 may illustrate phase shifts in degrees along the right y-axis. The simulations 200 may be shown at multiple (variable) capacitance values of the capacitor 164 (e.g., 0.4 picofarad (pF) and 5 pF) and with the capacitor 164 short circuited (e.g., zero pF) over a range of available variable capacitances (e.g., zero pF to 10 pF). Other variable capacitance ranges may be implemented to meet the design criteria of a particular application.

A curve 202 may illustrate the S31 s-parameter with the 5 pF capacitor 164. A curve 204 may illustrate the S32 s-parameter with the 5 pF capacitor 164. The curves 202 and 204 generally show a bandpass response ranging from about 2 GHz to around 17 GHz (e.g., at −15 dB).

A curve 206 may illustrate the S31 s-parameter with the 0.4 pF capacitor 164. A curve 208 may illustrate the S32 s-parameter with the 0.4 pF capacitor 164. The curves 206 and 208 generally show a bandpass response from about 2 GHz to around 22 GHz (e.g., at −15 dB).

A curve 210 may illustrate the S31 s-parameter with the 0 pF capacitor 164. A curve 212 may illustrate the S32 s-parameter with the 0 pF capacitor 164. The curves 210 and 212 generally show a bandpass response from about 2 GHz to around 27 GHz (e.g., at −15 dB). Implementing the output balun 106 with different values for the capacitor 164 and/or the input balun 102 with different values for the capacitor 134, may allow for adjustment of the operational bandwidth of the MMIC amplifier 100.

Embodiments of the invention generally integrates multiple (e.g., two) functionalities, such as impedance transformer and power combiner, into the MMIC amplifier 100. Therefore, MMIC amplifier 100 may occupy a compact die size. Various embodiments of the invention may also improve output power combining efficiency due to the simplifying technique of the input balun 102 and the output balun 106.

The functions and structures illustrated in the diagrams of FIGS. 1 to 7 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    an input transformer on a substrate and configured to convert an input signal into a differential input signal, wherein said input signal is a radio-frequency signal;
    an amplifier on said substrate and configured to generate a differential output signal in response to said differential input signal, wherein said amplifier is a balanced and distributed amplifier; and
    an output transformer on said substrate and configured to convert said differential output signal into an output signal, wherein each of said input transformer and said output transformer comprises a three line coupled balun transformer with a variable bandpass bandwidth.

2. The apparatus according to claim 1, wherein said input transformer, said amplifier, said output transformer and said substrate are part of a monolithic microwave integrated circuit.

3. The apparatus according to claim 1, wherein said input transformer comprises a variable capacitance configured to (i) terminate said input signal and (ii) vary said bandpass bandwidth of said input transformer.

4. The apparatus according to claim 1, wherein said output transformer comprises a variable capacitance configured to (i) connect an output node of said output transformer to ground and (ii) vary said bandpass bandwidth of said output transformer.

5. The apparatus according to claim 4, wherein said variable capacitance ranges from zero picofarad to five picofarad.

6. The apparatus according to claim 1, wherein each of said input transformer and said output transformer further comprises a planar transformer.

7. The apparatus according to claim 1, wherein each of said input transformer and said output transformer comprises six planar inductors with three lines wrapped in two coils.

8. The apparatus according to claim 1, wherein each of said input transformer and said output transformer comprises a 1:1 impedance transformer.

9. The apparatus according to claim 1, wherein said input signal is a microwave frequency signal.

10. The apparatus according to claim 1, wherein said input signal is a millimeter-wave frequency signal.

11. A method for balanced distributed power amplification, comprising the steps of:
    converting an input signal into a differential input signal using an input transformer on a substrate, wherein said input signal is a radio-frequency signal;
    generating a differential output signal in response to said differential input signal using an amplifier on said substrate, wherein said amplifier is a balanced and distributed amplifier; and
    converting said differential output signal into an output signal using an output transformer on said substrate, wherein each of said input transformer and said output transformer comprises a three line coupled balun transformer with a variable bandpass bandwidth.

12. The method according to claim 11, wherein said input transformer, said amplifier, said output transformer and said substrate are part of a monolithic microwave integrated circuit.

13. The method according to claim 11, further comprising the step of:
    varying said bandpass bandwidth of said input transformer using a variable capacitance configured to terminate said input signal.

14. The method according to claim 11, further comprising the step of:
    varying said bandpass bandwidth of said output transformer using a variable capacitance that connects an output node of said output transformer to ground.

15. The method according to claim 14, wherein said variable capacitance ranges from zero picofarad to five picofarad.

16. The method according to claim 11, wherein each of said input transformer and said output transformer further comprises a planar transformer.

17. The method according to claim 11, wherein each of said input transformer and said output transformer comprises six planar inductors with three lines wrapped in two coils.

18. The method according to claim 11, wherein each of said input transformer and said output transformer comprises a 1:1 impedance transformer.

19. The method according to claim 11, wherein said input signal is a microwave frequency signal.

20. The method according to claim 11, wherein said input signal is a millimeter-wave frequency signal.

* * * * *